US007782928B2

(12) United States Patent
Kang et al.

(10) Patent No.: US 7,782,928 B2
(45) Date of Patent: Aug. 24, 2010

(54) METHOD AND APPARATUS FOR SELF-CALIBRATION IN A MOBILE TRANSCEIVER

(75) Inventors: Hyun-Il Kang, Gyeonggi-do (KR); Chang-Seok Lee, Daejeon (KR); Jae-Kon Lee, Suwon-si (KR); Jong-Ae Park, Yongin-si (KR); Jae-Sup Lee, Yongin-si (KR); Tae-Wook Kim, Chungcheongnam-do (KR); Sang-Hyun Woo, Seoul (KR)

(73) Assignee: Samsung Electronics Co., Ltd (KR)

( * ) Notice: Subject to any disclaimer, the term of this patent is extended or adjusted under 35 U.S.C. 154(b) by 969 days.

(21) Appl. No.: 11/508,569

(22) Filed: Aug. 23, 2006

(65) Prior Publication Data

US 2007/0047634 A1 Mar. 1, 2007

(30) Foreign Application Priority Data

Aug. 23, 2005 (KR) .................. 10-2005-0077395

(51) Int. Cl.
 *H04B 1/38* (2006.01)
(52) U.S. Cl. .................. 375/221; 375/219; 375/285; 455/73
(58) Field of Classification Search .......... 375/219, 375/221, 224, 284, 285, 298, 271, 295, 296, 375/302, 316, 319, 322, 324; 455/73, 67.11, 455/67.13, 67.14, 295, 296, 302, 316, 319, 455/322, 324, 63.1, 110, 114.2, 115.1, 115.2, 455/126, 226.1, 284, 285, 298, 271
See application file for complete search history.

(56) References Cited

U.S. PATENT DOCUMENTS

| 5,705,949 | A | * | 1/1998 | Alelyunas et al. ........... 329/304 |
| 6,798,844 | B2 | * | 9/2004 | Ratto ......................... 375/296 |
| 7,310,387 | B2 | | 12/2007 | Kim et al. |
| 2003/0027610 | A1 | | 2/2003 | Loke |
| 2003/0174641 | A1 | | 9/2003 | Rahman |
| 2003/0202618 | A1 | * | 10/2003 | Jensen et al. ................. 375/319 |
| 2003/0223480 | A1 | * | 12/2003 | Cafarella .................... 375/219 |
| 2004/0106380 | A1 | * | 6/2004 | Vassiliou et al. ............. 455/73 |
| 2004/0202236 | A1 | * | 10/2004 | Kv Kumar .................. 375/219 |
| 2005/0157815 | A1 | | 7/2005 | Kim et al. |
| 2005/0260949 | A1 | * | 11/2005 | Kiss et al. ................. 455/67.14 |
| 2006/0034356 | A1 | * | 2/2006 | Fechtel ....................... 375/219 |
| 2006/0223457 | A1 | * | 10/2006 | Rahman ...................... 455/73 |

FOREIGN PATENT DOCUMENTS

KR 1020050066953 6/2005

* cited by examiner

*Primary Examiner*—Betsy L Deppe
(74) *Attorney, Agent, or Firm*—The Farrell Law Firm, LLP

(57) ABSTRACT

Disclosed is a method and an apparatus for self-calibrating direct current (DC) offset and imbalance between orthogonal signals, which may occur in a mobile transceiver. In the apparatus, a transmitter of a mobile terminal functions as a signal generator, and a receiver of the mobile terminal functions as a response characteristic detector. Further, a baseband processor applies test signals to the transmitter, receives the test signals returning from the receiver, and compensates the imbalance and DC offset for the transmitter side and the receiver side by using the test signals.

11 Claims, 4 Drawing Sheets

US 7,782,928 B2

METHOD AND APPARATUS FOR SELF-CALIBRATION IN A MOBILE TRANSCEIVER

PRIORITY

This application claims the benefit under 35 U.S.C. §119(a) of an application filed in the Korean Industrial Property Office on Aug. 23, 2005 and assigned Serial No. 2005-77395, the contents of which are incorporated herein by reference.

BACKGROUND OF THE INVENTION

1. Field of the Invention

The present invention relates to a method and an apparatus for self-calibration in a mobile transceiver, and more particularly to a method and an apparatus for self-calibrating direct current (DC) offset and imbalance between orthogonal signals, which may occur in a mobile transceiver.

2. Description of the Related Art

In general, basic causes of degrading performance of mobile transceivers include undesired or non-ideal characteristics, such as DC offset and I/Q imbalance.

The DC offset is the effect of self mixing by a mixer in a DC offset wireless receiver. The DC offset occurs when a signal of a Local Oscillator (LO) returns after leaking toward an antenna or when a Radio Frequency (RF) modulation signal input through the antenna is leaked to the LO. The DC offset value generated in this way may saturate a BaseBand (BB) circuit.

The I/Q imbalance is caused when the phase difference between the in-phase channel signal (I channel signal) and the quadrature-phase channel signal (Q channel signal) generated in an oscillator of a wireless transmitter is not 90 degrees. The I/Q imbalance can be reduced by designing mixers of the I channel demodulator and the Q channel demodulator to be symmetric to each other. However, designing the mixers to be symmetric to each other requires increases in the volume and current consumption of the mixers. Such I/Q imbalance increases the Bit Error Rate (BER), thereby degrading the performance of the wireless transceiver.

Therefore, in order to improve the performance of a wireless transceiver, it is necessary to arrange a solution for compensating for the DC offset and the I/Q imbalance.

FIG. 1 illustrates a representative example of a process for self-estimating and self-calibrating a DC offset and an I/Q imbalance which occur in a conventional wireless transceiver. The example shown in FIG. 1 is disclosed in a Patent Cooperation Treaty (PCT) application No. 2004/023667, entitled "Direct conversion transceiver enabling digital calibration," and a paper by James K. Cavers, entitled "New Methods for Adaptation of Quadrature Modulators and Demodulators in Amplifier Linearization Circuits." For the convenience of description, the estimation path is not distinguished into an I channel path and a Q channel path. However, the same application is possible even when the estimation path is distinguished into an I channel path and a Q channel path.

The solution proposed in FIG. 1 calibrates both the I/Q imbalance and the DC offset generated at a transmission (TX) side and a reception (RX) side. To this end, the calibration for the TX side is first performed, and the calibration for the RX side is then performed. The calibration for the TX side corresponds to imbalance calibration between I channel and Q channel (TX IQ calibration). The calibration for the RX side includes calibration for the DC offset as well as the imbalance calibration between the I channel and the Q channel.

Further, for the calibration for the RX side, the calibration for the TX side must first be performed. In other words, the calibration for the RX side is possible only after the calibration for the TX.

For the calibration for the TX side, an estimation of the DC offset and the I/Q imbalance at the TX side must first be performed. In the estimation shown in FIG. 1, a discrete detector is used. The discrete detector converts an envelope signal output from a drive amplifier of the TX side into a BaseBand (BB) signal and performs a discrete Fourier series for a complex envelope waveform of the BB signal. Based on the discrete Fourier series, the discrete detector estimates the gain imbalance, the phase imbalance, and the DC offset of each of the I channel and the Q channel at the TX side.

However, in the case of the estimation as described above, it is necessary to incorporate the non-ideal factors, which include a differential gain and a DC value. In the above-mentioned paper and patent application, the non-ideal factors are estimated.

Therefore, the TX and RX gain imbalance, phase imbalance, and DC offsets of the I channel and Q channel obtained through this estimation may be incorrect. Further, as noted from FIG. 1, many separate diodes, registers, capacitors, and switches are necessary in order to construct the discrete detector.

SUMMARY OF THE INVENTION

Accordingly, the present invention has been made to solve at least the above-mentioned problems occurring in the prior art, and an aspect of the present invention is to provide an apparatus and a method for self-estimating and self-calibrating the DC offset characteristics and the imbalance characteristics.

It is another aspect of the present invention to provide an apparatus and a method for estimating and calibrating for the DC offset characteristics and the imbalance characteristics in a single path connected between a transmission side and a reception side.

It is another aspect of the present invention to provide an apparatus and a method for estimating the DC offset characteristics of a reception side by using a test signal which is transmitted from a transmission side and is then received by the reception side.

It is another aspect of the present invention to provide an apparatus and a method for estimating the imbalance characteristics of a reception side by using a test signal which is transmitted from a transmission side and is then received by the reception side.

It is another aspect of the present invention to provide an apparatus and a method for estimating the imbalance characteristics of a transmission side by using a test signal which is transmitted from the transmission side and is then received by a reception side. In order to accomplish these aspects, there is provided a method for self-calibrating in a transceiver, the method includes generating a pair of signals including a first in-phase channel test transmission signal and a first quadrature-phase channel test transmission signal in an analog baseband; converting the first in-phase channel test transmission signal and the first quadrature-phase channel test transmission signal from the analog baseband to an Radio Frequency (RF) band and applying the first in-phase channel test transmission signal and the first quadrature-phase channel test transmission signal of the RF band to a reception side through a test path for applying an RF band signal from a transmission side to the reception side; converting the first in-phase channel test transmission signal and the first quadrature-phase channel test transmission signal of the RF band to a first in-phase channel test reception signal and a first quadrature-phase channel test reception signal of the analog baseband; generating a pair of signals including a second in-phase channel test transmission signal and a second quadrature-phase channel test transmission signal in the analog baseband; converting the second in-phase channel test transmission signal and the second quadrature-phase channel test transmission signal from the analog baseband to an RF band and applying the second in-phase channel test transmission signal and the second quadrature-phase channel test transmission signal of the RF band to the reception side through the test path; converting the second in-phase channel test transmission signal and the second quadrature-phase channel test transmission signal of the RF band to a second in-phase channel test reception signal and a second quadrature-phase channel test reception signal of the analog baseband; estimating and calibrating a direct current (DC) offset characteristic for an in-phase channel reception signal in the analog baseband of the reception side by using a mean value of the first in-phase channel test reception signal and the second in-phase channel test reception signal of the analog baseband; and estimating and calibrating a DC offset characteristic for a quadrature-phase channel reception signal in the analog baseband of the reception side by using a mean value of the first quadrature-phase channel test reception signal and the second quadrature-phase channel test reception signal of the analog baseband.

In accordance with another aspect of the present invention, there is provided a method for self-calibrating in a transceiver, the method includes generating a pair of signals including a first in-phase channel test transmission signal and a first quadrature-phase channel test transmission signal in an analog baseband; converting the first in-phase channel test transmission signal and the first quadrature-phase channel test transmission signal from the analog baseband to an Radio Frequency(RF) band and applying the first in-phase channel test transmission signal and the first quadrature-phase channel test transmission signal of the RF band to a reception side through a test path for applying an RF band signal from a transmission side to the reception side; converting the first in-phase channel test transmission signal and the first quadrature-phase channel test transmission signal of the RF band to a first in-phase channel test reception signal and a first quadrature-phase channel test reception signal of the analog baseband; generating a pair of signals including a third in-phase channel test transmission signal and a third quadrature-phase channel test transmission signal in the analog baseband; converting the third in-phase channel test transmission signal and the third quadrature-phase channel test transmission signal from the analog baseband to an RF band and applying the third in-phase channel test transmission signal and the third quadrature-phase channel test transmission signal of the RF band to the reception side through the test path; converting the third in-phase channel test transmission signal and the third quadrature-phase channel test transmission signal of the RF band to a third in-phase channel test reception signal and a third quadrature-phase channel test reception signal of the analog baseband; calculating a gain imbalance of the reception side by using the first in-phase channel test reception signal and the third in-phase channel test reception signal of the analog baseband and the first quadrature-phase channel test reception signal and the third quadrature-phase channel test reception signal of the analog baseband; calculating a phase imbalance of the reception side by using the first in-phase channel test reception signal and the third in-phase channel test reception signal of the analog baseband and the first quadrature-phase channel test reception signal and the third quadrature-phase channel test reception signal of the analog baseband; calculating calibration values by using the gain imbalance and the phase imbalance; and calibrating imbalance characteristics between an in-phase channel signal and a quadrature-phase channel signal in a digital baseband of the reception side by using the calibration values.

In order to accomplish these aspects, there is provided a method for self-calibrating in a transceiver, the method includes generating a pair of signals including an in-phase channel test transmission signal and a quadrature-phase channel test transmission signal in an analog baseband; converting the in-phase channel test transmission signal and the quadrature-phase channel test transmission signal from the analog baseband to an RF band and applying the in-phase channel test transmission signal and the quadrature-phase channel test transmission signal of a Radio Frequency(RF) band to a reception side through a test path for applying an RF band signal from a transmission side to the reception side; converting the in-phase channel test transmission signal and the quadrature-phase channel test transmission signal of the RF band to an in-phase channel test reception signal and a quadrature-phase channel test reception signal of the analog baseband; calculating a gain imbalance of the reception side by using the in-phase channel test reception signal and the quadrature-phase channel test reception signal of the analog baseband; calculating a phase imbalance of the reception side by using the in-phase channel test reception signal and the quadrature-phase channel test reception signal of the analog baseband; calculating calibration values by using the gain imbalance and the phase imbalance; and calibrating imbalance characteristics between an in-phase channel signal and a quadrature-phase channel signal in a digital baseband of the transmission side by using the calibration values.

In order to accomplish these aspects, there is provided a method for self-calibrating in, the method includes applying a pair of signals including a first in-phase channel test transmission signal and a first quadrature-phase channel test transmission signal to the transmission side and receiving a first in-phase channel test reception signal and a first quadrature-phase channel test reception signal from the reception side; applying a pair of signals including a second in-phase channel test transmission signal and a second quadrature-phase channel test transmission signal to the transmission side and receiving a second in-phase channel test reception signal and a second quadrature-phase channel test reception signal from the reception side; calibrating a direct current (DC) offset characteristic for an in-phase channel reception signal in the analog baseband of the reception side by using a mean value of the first in-phase channel test reception signal and the second in-phase channel test reception signal of the analog baseband; calibrating a DC offset characteristic for a quadrature-phase channel reception signal in the analog baseband of the reception side by using a mean value of the first quadrature-phase channel test reception signal and the second quadrature-phase channel test reception signal of the analog baseband; applying the first in-phase channel test transmission signal and the first quadrature-phase channel test transmission signal to the transmission side and then receiving the first in-phase channel test reception signal and the first quadrature-phase channel test reception signal from the reception side; applying a pair of signals including a third in-phase channel test transmission signal and a third quadrature-phase channel test transmission signal to the transmission side and receiving a third in-phase channel test reception signal and a third quadrature-phase channel test reception signal from the reception side; calculating a gain imbalance $\alpha 2$ of the reception side by substituting the first in-phase channel test reception signal $I1_{RX}$ and the third in-phase channel test reception signal $I3_{RX}$ of the analog baseband and the first quadrature-phase channel test reception signal $Q1_{RX}$ and the third quadrature-phase channel test reception signal $Q3_{RX}$ of the analog baseband into $$\alpha 2 = \sqrt{\frac{Q1_{RX}^2 + Q3_{RX}^2}{I1_{RX}^2 + I3_{RX}^2}};$$

calculating a phase imbalance $\phi 2$ of the reception side by substituting the first in-phase channel test reception signal $I1_{RX}$ and the third in-phase channel test reception signal $I3_{RX}$ of the analog baseband and the first quadrature-phase channel test reception signal $Q1_{RX}$ and the third quadrature-phase channel test reception signal $Q3_{RX}$ of the analog baseband into $$\phi 2 = \tan^{-1}\left(\frac{I3_{RX} \times Q3_{RX} + I1_{RX} \times Q1_{RX}}{I1_{RX} \times Q3_{RX} + I3_{RX} \times Q1_{RX}}\right);$$

calculating calibration values K and L by substituting the gain imbalance $\alpha 2$ and the phase imbalance $\phi 2$ into $$K = -\tan\phi 2$$
$$L = \frac{1}{\alpha 2 \cos\phi 2}; \text{ and}$$

calibrating imbalance characteristics between an in-phase channel signal and a quadrature-phase channel signal in a digital baseband of the reception side by using the calibration values K and L.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
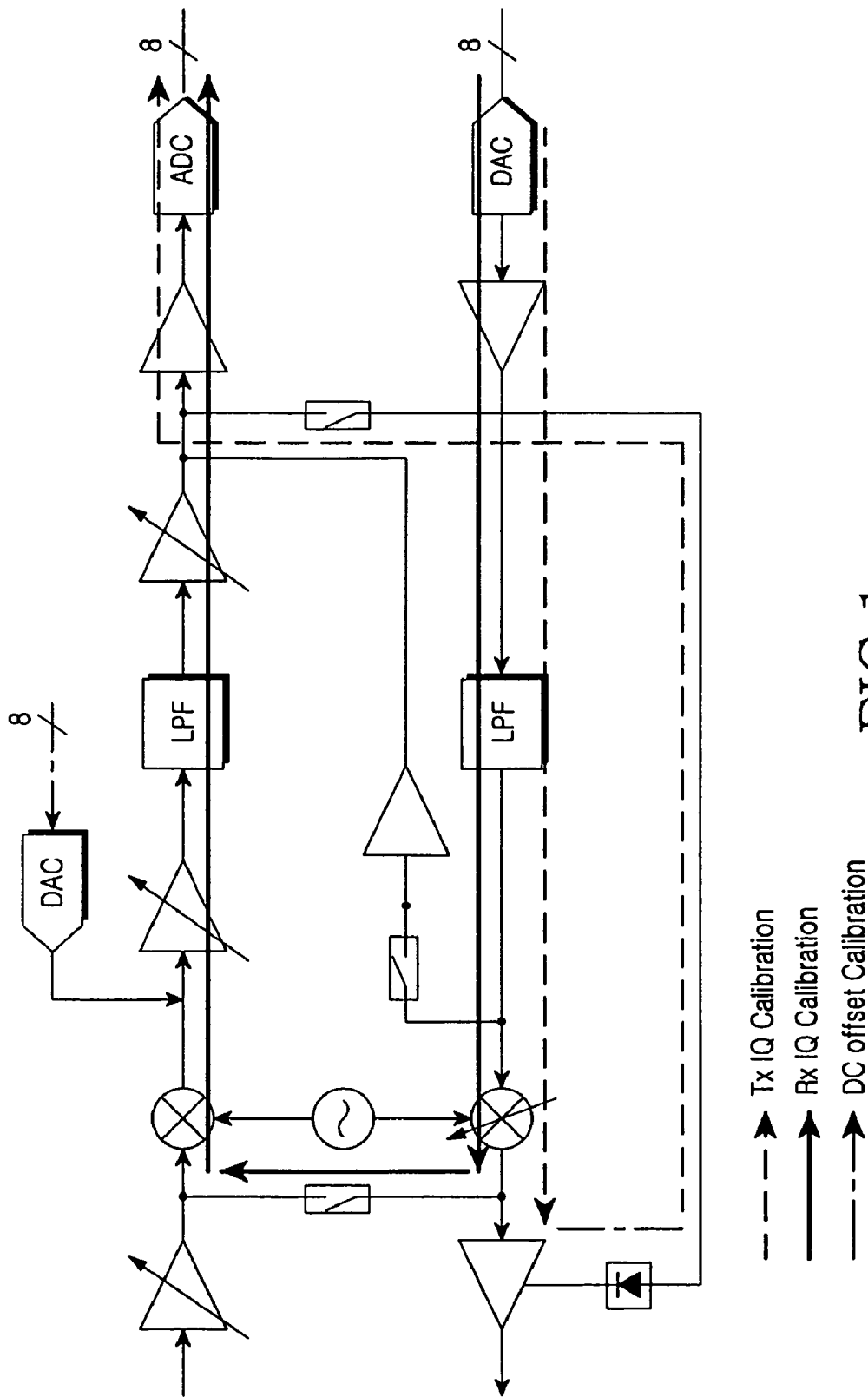
FIG. 1 illustrates a representative example of a process for self-estimating and self-calibrating a DC offset and an I/Q imbalance which occur in a conventional wireless transceiver.

Hereinafter, preferred embodiments of the present invention will be described with reference to the accompanying drawings. In the following description, a detailed description of known functions and configurations incorporated herein will be omitted when it may make the subject matter of the present invention rather unclear.

Before description of preferred embodiments, terms used herein are defined as follows:

$I1_{TX}$: a $1^{st}$ in-phase channel test signal which is applied through the I channel path of the TX side in order to calibrate the imbalance characteristics between the I channel path and the Q channel path and the DC offset characteristic occurring in the I channel path of the RX side;

$I2_{TX}$: a $2^{nd}$ in-phase channel test signal which is applied through the I channel path of the TX side in order to calibrate the DC offset characteristic occurring in the I channel path of the RX side and has a phase difference of 180 degrees with respect to the $I1_{TX}$;

$I3_{TX}$: a $3^{rd}$ in-phase channel test signal which is applied through the I channel path of the TX side in order to calibrate the imbalance characteristics between the I channel path and the Q channel path of the RX side and has a phase difference of 90 degrees with respect to the $I1_{TX}$;

$Q1_{TX}$: a $1^{st}$ quadrature-phase channel test signal which is applied through the Q channel path of the TX side in order to calibrate the imbalance characteristics between the I channel path and the Q channel path and the DC offset characteristic occurring in the Q channel path of the RX side;

$Q2_{TX}$: a $2^{nd}$ quadrature-phase channel test signal which is applied through the Q channel path of the TX side in order to calibrate the DC offset characteristic occurring in the Q channel path of the RX side and has a phase difference of 180 degrees with respect to the $Q1_{TX}$;

$Q3_{TX}$: a $3^{rd}$ quadrature-phase channel test signal which is applied through the Q channel path of the TX side in order to calibrate the imbalance characteristics between the I channel path and the Q channel path of the RX side and has a phase difference of 90 degrees with respect to the $IQ_{TX}$;

$I1_{RX}$: a $1^{st}$ in-phase channel test signal which is output through the I channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I1_{TX}$ and $Q1_{TX}$ input through the I channel and the Q channel to the mixer of the TX side, respectively;

$I2_{RX}$: a $2^{nd}$ in-phase channel test signal which is output through the I channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I2_{TX}$ and $Q2_{TX}$ input through the I channel and the Q channel to the mixer of the TX side, respectively;

$I3_{RX}$: a $3^{rd}$ in-phase channel test signal which is output through the I channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I3_{TX}$ and $Q3_{TX}$ input through the I channel and the Q channel to the mixer of the TX side, respectively;

$Q1_{RX}$: a $1^{st}$ quadrature-phase channel test signal which is output through the Q channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I1_{TX}$ and $Q1_{TX}$ input through the I channel path and the Q channel path to the mixer of the TX side, respectively;

$Q2_{RX}$: a $2^{nd}$ quadrature-phase channel test signal which is output through the Q channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I2_{TX}$ and $Q2_{TX}$ input through the I channel path and the Q channel path to the mixer of the TX side, respectively;

$Q3_{RX}$: a $3^{rd}$ quadrature-phase channel test signal which is output through the I channel path of the RX side from a mixer of the RX side and is obtained from an RF RX signal input to the mixer of the RX side, wherein the RF RX signal is obtained from an RF TX signal output from a mixer of the TX side and the RF TX signal is obtained by mixing $I3_{TX}$ and $Q3_{TX}$ input through the I channel path and the Q channel path to the mixer of the TX side, respectively;

$LO_{II}$: a carrier frequency which is used to convert a Radio Frequency (RF) band signal to a baseband signal in the I channel path of the RX side;

$LO_{QQ}$: a carrier frequency which is used to convert an RF band signal to a baseband signal in the Q channel path of the RX side;

$LO_I$: a carrier frequency which is used to convert a baseband signal to an RF band signal in the I channel path of the TX side;

$LO_Q$: a carrier frequency which is used to convert a baseband signal to an RF band signal in the Q channel path of the TX side;

$I_{TX}$: an in-phase channel test signal which is applied through the I channel path of the TX side in order to obtain the imbalance characteristic of the TX side; and $Q_{TX}$: a quadrature-phase channel test signal which is applied through the Q channel path of the TX side in order to obtain the imbalance characteristic of the TX side.

Hereinafter, a method for estimation of imbalance characteristics and DC offset characteristics according to an embodiment of the present invention by a mobile terminal, in which a test signal generated by a transmitter side is provided to a receiver side and is then used to estimate the imbalance characteristics and DC offset characteristics, will be described in detail. The test signal has a predetermined shape which includes a shape of a simple wave, such as a sine wave or a cosine wave.

Figure 2:
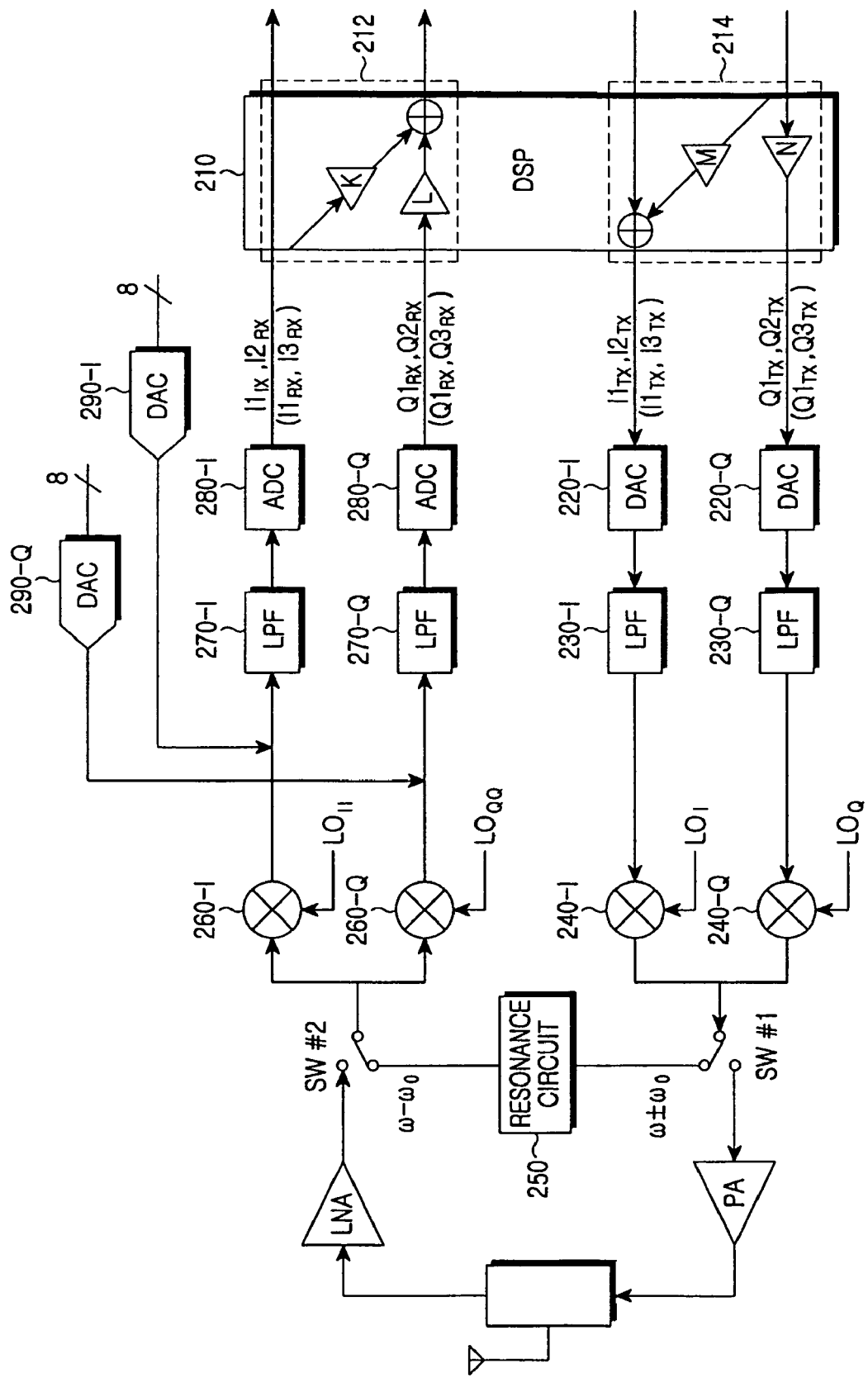
FIG. 2 is a block diagram which illustrates a structure of a mobile terminal according to the present invention.

FIG. 2 is a block diagram which illustrates a structure of a mobile terminal according to the present invention.

Referring to FIG. 2, the TX side includes Digital-to-Analog Converters (DACs) 220-I and 220-Q, Low Pass Filters (LPFs) 230-I and 230-Q, and mixers 240-I and 240-Q, which are arranged along the I channel path and the Q channel path of the TX side, respectively. Further, the RX side includes mixers 260-I and 260-Q, LPFs 270-I and 270-Q, and Analog-to-Digital Converters (ADCs) 280-I and 280-Q, which are arranged along the I channel path and the Q channel path of the RX side, respectively.

The Digital Signal Processor (DSP) 210 generates predefined test signals, applies the generated test signals to the TX side, and estimates the DC offset and imbalance characteristics by using the test signals returning from the RX side. Further, based on the estimated DC offset and imbalance characteristics of the RX side, the DSP 210 calibrates the DC offset and imbalance characteristics of the RX side. Further, by using the already calibrated RX side, the DSP 210 estimates and pre-calibrates the imbalance of the TX side.

First, the DSP 210 applies a test signal to the DAC 220-I and the DAC 220-Q, in order to estimate the DC offset characteristics for the I channel path and the Q channel path of the RX side. The DSP 210 first applies $I1_{TX}$ to the DAC 220-I and $Q1_{TX}$ to the DAC 220-Q, and then applies $I2_{TX}$ to the DAC 220-I and $Q2_{TX}$ to the DAC 220-Q. That is, $I1_{TX}$ and $Q1_{TX}$ are simultaneously applied first, and $I2_{TX}$ and $Q2_{TX}$ are simultaneously applied after a predetermined time interval from the application of $I1_{TX}$ and $Q1_{TX}$. In this process, $I1_{TX}$ and $Q1_{TX}$ and $I2_{TX}$ and $Q2_{TX}$ must satisfy a predetermined condition. Specifically, $I1_{TX}$ and $Q1_{TX}$ must have a phase difference of 180 degrees, and $I2_{TX}$ and $Q2_{TX}$ must also have a phase difference of 180 degrees.

For example, $I1_{TX}$, $Q1_{TX}$, $I2_{TX}$, and $Q2_{TX}$ can be defined by Equation (1)

$$I1_{TX}(t) = \cos \overline{\omega}_0 t$$

$$Q1_{TX}(t) = \sin \overline{\omega}_0 t$$

$$I2_{TX}(t) = -\cos \overline{\omega}_0 t$$

$$Q2_{TX}(t) = -\sin \overline{\omega}_0 t \quad (1)$$

The DAC 220-I converts the sequentially input $I1_{TX}$ and $I2_{TX}$ to analog signals and then inputs the converted analog signals to the LPF 230-I. The DAC 220-Q converts the sequentially input $Q1_{TX}$ and $Q2_{TX}$ to analog signals and then inputs the converted analog signals to the LPF 230-Q.

The analog signals converted from $I1_{TX}$ and $I2_{TX}$ are filtered by the LPF 230-I and are then converted to RF band signals by the mixer 240-I. The analog signals converted from $Q1_{TX}$ and $Q2_{TX}$ are filtered by the LPF 230-Q and are then converted to RF band signals by the mixer 240-Q. The carrier in the mixer 240-I corresponds to $LO_1$ and the carrier in the mixer 240-Q corresponds to $LO_Q$. $LO_I$ and $LO_Q$ can be defined by Equation (2)

$$LO_I = \cos \overline{\omega} t$$

$$LO_Q = \alpha 1 \sin(\overline{\omega} t + \phi 1) \quad (2)$$

In Equation (2), $\alpha 1$ denotes the gain imbalance characteristic between the I channel path and the Q channel path of the TX side, and $\phi 1$ denotes the phase imbalance characteristic between the I channel path and the Q channel path of the TX side.

The converted RF band signals, that is, the RF TX signals, can be classified into a first RF TX signal and a second RF TX signal by the applied test signals. The first RF TX signal is generated from $I1_{TX}$ and $Q1_{TX}$, and the second RF TX signal is generated from $I2_{TX}$ and $Q2_{TX}$. In the following description, the first RF TX signal and the second RF TX signal will be referred to as "RF TX signal."

The RF TX signal, which is the converted RF band signal, includes a $\overline{\omega} \pm \overline{\omega}_0$ component. The RF TX signal including the $\overline{\omega} \pm \overline{\omega}_0$ component is transferred to the RX side through a test route defined by a first switch SW#1 and a second switch SW#2.

A resonance circuit 250 disposed in the test route eliminates a $\overline{\omega} + \overline{\omega}_0$ component from the $\overline{\omega} \pm \overline{\omega}_0$ component included in the RF TX signal. Therefore, the RF TX signal transferred to the RX side through the second switch SW#2 includes only a $\overline{\omega} - \overline{\omega}_0$ component. The RF RX signals applied to the RX side through the second switch SW#2 are converted to baseband signals by the mixer 260-I, which are then filtered by the LPF 270-I in the I channel path. The baseband signals converted by the mixer 260-I include $I1_{RX}$ and $I2_{RX}$.

Also, the RF RX signals applied to the RX side through the second switch SW#2 are converted to baseband signals by the mixer 260-Q, which are then filtered by the LPF 270-Q in the Q channel path. The baseband signals converted by the mixer 260-Q include $Q1_{RX}$ and $Q2_{RX}$.

The carrier used at the mixer 260-I is $LO_{II}$ and the carrier used at the mixer 260-Q is $LO_{QQ}$. $LO_{II}$ and $LO_{QQ}$ can be defined by Equation (3).

$$LO_{II} = \cos \overline{\omega} t$$

$$LO_{QQ} = \alpha 2 \sin(\overline{\omega} t + \phi 2) \quad (3)$$

In Equation (3), $\alpha 2$ denotes the gain imbalance characteristic between the I channel path and the Q channel path of the TX side, and $\phi 2$ denotes the phase imbalance characteristic between the I channel path and the Q channel path of the TX side.

After the filtering, $I1_{TX}$ and $I2_{TX}$ are converted to digital signals by the ADC 280-I, and $Q1_{TX}$ and $Q2_{TX}$ are converted to digital signals by the ADC 280-Q.

$I1_{TX}$ and $I2_{TX}$ output from the ADC 280-I correspond to $I1_{RX}$ and $I2_{RX}$, and $Q1_{TX}$ and $Q2_{TX}$ output from the ADC 280-Q correspond to $Q1_{RX}$ and $Q2_{RX}$. Then, $I1_{RX}$, $I2_{RX}$, $Q1_{RX}$ and $Q2_{RX}$ are provided to the DSP 210.

The DSP 210 estimates the DC offset characteristic $\Delta I$ of the I channel path of the RX side by using $I1_{RX}$ and $I2_{RX}$, and estimates the DC offset characteristic $\Delta Q$ of the Q channel path by using $Q1_{RX}$ and $Q2_{RX}$.

$$\Delta I = \frac{I1_{RX}(t) + I2_{RX}(t)}{2} \tag{4}$$

$$\Delta Q = \frac{Q1_{RX}(t) + Q2_{RX}(t)}{2}$$

As noted from Equation (4), $\Delta I$ can be estimated as a mean value of test signals $I1_{RX}$ and $I2_{RX}$ which are consecutively received through the I channel path, and $\Delta Q$ can be estimated as a mean value of test signals $Q1_{RX}$ and $Q2_{RX}$ which are consecutively received through the Q channel path.

The DSP 210 determines a calibration value for calibrating $\Delta I$ and a calibration value for calibrating $\Delta Q$.

The calibration value for calibrating $\Delta I$ is transferred to the DAC 290-I and is converted to an analog signal by the DAC 290-I, and the calibration value for calibrating $\Delta Q$ is transferred to the DAC 290-Q and is converted to an analog signal by the DAC 290-Q.

The DC offset characteristic for the received signals in an analog baseband in the I channel of the RX side is counterbalanced by the analog signal converted from $\Delta I$. The analog baseband in the I channel of the RX side corresponds to the section from the output port of the mixer 260-I to the input port of the LPF 270-I.

The DC offset characteristic for the received signals in an analog baseband in the Q channel of the RX side is counterbalanced by the analog signal converted from $\Delta Q$. The analog baseband in the Q channel of the RX side corresponds to the section from the output port of the mixer 260-Q to the input port of the LPF 270-Q.

Next, the DSP 210 applies test signals to the DAC 220-I and the DAC 220-Q in order to estimate the imbalance characteristic between the I channel path and the Q channel path of the RX side. Specifically, the DSP 210 sequentially applies $I1_{TX}$ and $I3_{TX}$ to the DAC 220-I and sequentially applies $Q_{TX}$ and $Q3_{TX}$ to the DAC 220-Q. Here, $I1_{TX}$ and $Q1_{TX}$ are simultaneously applied, and $I3_{TX}$ and $Q3_{TX}$ are simultaneously applied at a point in time after the passage of a predetermined time interval from the application of $I1_{TX}$ and $Q1_{TX}$. Here, $I1_{TX}$ and $I3_{TX}$, and $Q1_{TX}$ and $Q3_{TX}$ are required to satisfy a predetermined condition. That is, $I1_{TX}$ and $I3_{TX}$ must have a phase difference of 90 degrees between them, and $Q1_{TX}$ and $Q3_{TX}$ must also have a phase difference of 90 degrees between them.

$I1_{TX}$ and $I3_{TX}$, and $Q1_{TX}$ and $Q3_{TX}$ can be defined by Equation (5)

$$I1_{TX}(t) = \cos\overline{\omega}_0 t \tag{5}$$
$$Q1_{TX}(t) = \sin\overline{\omega}_0 t$$
$$I3_{TX}(t) = \cos\left(\overline{\omega}_0 t + \frac{\pi}{2}\right) = -\sin\overline{\omega}_0 t$$
$$Q3_{TX}(t) = \sin\left(\overline{\omega}_0 t + \frac{\pi}{2}\right) = \cos\overline{\omega}_0 t$$

The DAC 220-I converts the sequentially input $I1_{TX}$ and $I3_{TX}$ to analog signals and then inputs the converted analog signals to the LPF 230-I, and the DAC 220-Q converts the sequentially input $Q1_{TX}$ and $Q3_{TX}$ to analog signals and then inputs the converted analog signals to the LPF 230-Q.

The analog signals converted from $I1_{TX}$ and $I3_{TX}$ are filtered by the LPF 230-I and are then converted to RF band signals by the mixer 240-I. The analog signals converted from $Q1_{TX}$ and $Q3_{TX}$ are filtered by the LPF 230-Q and are then converted to RF band signals by the mixer 240-Q. The carrier used at the mixer 240-I is $LO_I$ and the carrier used at the mixer 240-Q is $LO_Q$.

The RF TX signals, the converted RF band signals, can be classified into a third RF TX signal and a fourth RF TX signal based on the applied test signals. The third RF TX signal is an RF TX signal generated by $I1_{TX}$ and $Q1_{TX}$, and the fourth RF TX signal is an RF TX signal generated by $I3_{TX}$ and $Q3_{TX}$. In the following description, the third RF TX signal and the fourth RF TX signal will be referred to as "RF TX signal."

The RF TX signal includes a $\overline{\omega} \pm \overline{\omega}_0$ component. The RF TX signal including the component $\overline{\omega} \pm \overline{\omega}_0$ is transferred to the RX side through a test route defined by the first switch SW#1 and the second switch SW#2. The resonance circuit 250 disposed in the test route eliminates a $\overline{\omega} + \overline{\omega}_0$ component from the $\overline{\omega} \pm \overline{\omega}_0$ component included in the RF TX signal. Therefore, the RF TX signal transferred to the RX side through the second switch SW#2 includes only a $\overline{\omega} - \overline{\omega}_0$ component.

The RF RX signals applied to the RX side through the second switch SW#2 are converted to baseband signals by the mixer 260-I, which are then filtered by the LPF 270-I in the I channel path. The carrier used at the mixer 260-I is $LO_{II}$ and the converted baseband signals include $I1_{RX}$ and $I3_{RX}$.

Also, the RF RX signals applied to the RX side through the second switch SW#2 are converted to baseband signals by the mixer 260-Q, which are then filtered by the LPF 270-Q in the Q channel path. The carrier used at the mixer 260-Q is $LO_{QQ}$ and the converted baseband signals include $Q1_{RX}$ and $Q3_{RX}$.

After the filtering, $I1_{TX}$ and $I3_{TX}$ are converted to digital signals by the ADC 280-I, and $Q1_{TX}$ and $Q3_{TX}$ are converted to digital signals by the ADC 280-Q. $I1_{TX}$ and $I3_{TX}$ output from the ADC 280-I correspond to $I1_{RX}$ and $I3_{RX}$, and $Q1_{TX}$ and $Q3_{TX}$ output from the ADC 280-Q correspond to $Q1_{RX}$ and $Q3_{RX}$. Then, $I1_{RX}$, $I3_{RX}$, $Q1_{RX}$ and $Q3_{RX}$ are provided to the DSP 210.

The DSP 210 estimates the imbalance characteristics $\alpha 2$ and $\phi 2$ between the I channel path and the Q channel path of the RX side based on $I1_{RX}$ and $I3_{RX}$ and $Q1_{RX}$ and $Q3_{RX}$. $\alpha 2$ and $\phi 2$ can be defined by Equation (6).

$$\alpha 2 = \sqrt{\frac{Q1_{RX}^2 + Q3_{RX}^2}{I1_{RX}^2 + I3_{RX}^2}} \tag{6}$$

$$\phi 2 = \tan^{-1}\left(\frac{I3_{RX} \times Q3_{RX} + I1_{RX} \times Q1_{RX}}{I1_{RX} \times Q3_{RX} + I3_{RX} \times Q1_{RX}}\right)$$

The DSP 210 calculates calibration values K and L for calibrating the imbalance characteristic of the RX side by using the estimated α2 and φ2. K and L can be defined by Equation (7)

$$K = -\tan\phi 2 \qquad (7)$$
$$L = \frac{1}{\alpha 2\cos\phi 2}$$

Based on the calculated K and L, a first calibrator 212 within the DSP 210 calibrates the imbalance characteristics between the I channel reception signal and the Q channel reception signal. The calibration of the imbalance characteristics is to balance the I channel reception signal and the Q channel reception signal in order to achieve the desired phase difference (i.e. 90 degrees) between them. Therefore, it will do if the calibration of the imbalance characteristic is performed for only one of the I channel reception signal and the Q channel reception signal. FIG. 2 is based on an assumption that calibration is performed on the Q channel reception signal.

The first calibrator 212 adds the Q channel reception signal having been multiplied by the calibration value L and the I channel reception signal having been multiplied by the calibration value K, thereby outputting a new Q channel reception signal for which the imbalance characteristic has been calibrated. The calibration of the imbalance characteristic by the first calibrator 212 can be defined by Equation (8)

$$Q_{TX\_calibration} = K \times I_{RX} + L \times Q_{RX} \qquad (8)$$

In Equation (8), $Q_{TX\_calibration}$ denotes the Q channel reception signal for which the imbalance characteristic has been calibrated, $I_{RX}$ denotes the I channel reception signal, and $Q_{RX}$ denotes the Q channel reception signal.

Finally, the DSP 210 applies test signals to the I channel path and the Q channel path of the TX side in order to estimate the imbalance characteristic between the I channel path and the Q channel path of the TX side. The test signals include $I_{TX}$ and $Q_{TX}$, which can be defined by Equation (9)

$$I_{TX}=0$$
$$Q_{TX}=1 \qquad (9)$$

The DSP 210 applies $I_{TX}$ and $Q_{TX}$ to the TX side, and then receives $I_{RX}$ and $Q_{RX}$ through the I channel path and the Q channel path of the RX side. A process of applying $I_{TX}$ and $Q_{TX}$ to the TX side and then receiving $I_{RX}$ and $Q_{RX}$ is the same as the process described above, so detailed description thereof will be omitted here.

The DSP 210 estimates the imbalance characteristics α1 and φ1 between the I channel path and the Q channel path of the TX side based on $I_{RX}$ and $Q_{RX}$. α1 and φ1 can be defined by Equation (10)

$$\alpha 1 = \sqrt{I_{RX}^2 + Q_{RX}^2} \qquad (10)$$
$$\phi 1 = \tan^{-1}\frac{I_{RX}}{Q_{RX}}$$

In Equation (10), α1 denotes the gain imbalance characteristic between the I channel path and the Q channel path of the TX side, and φ1 denotes the phase imbalance characteristic between the I channel path and the Q channel path of the TX side.

The DSP 210 calculates calibration values M and N for calibrating the imbalance characteristics of the TX side by using the estimated α1 and φ1. Values M and N can be defined by Equation (11)

$$M = -\tan\phi 1 \qquad (11)$$
$$N = \frac{1}{\alpha 1\cos\phi 1}$$

A second calibrator 214 within the DSP 210 calibrates the imbalance characteristics between the I channel transmission signal and the Q channel transmission signal by using the calculated M and N. The calibration of the imbalance characteristics is to balance the I channel transmission signal and the Q channel transmission signal in order to achieve the desired phase difference (i.e. 90 degrees) between them.

The second calibrator 214 adds the Q channel transmission signal having been multiplied by the calibration value M and the I channel transmission signal, thereby outputting a new I channel transmission signal for which the imbalance characteristics has been calibrated. Further, the second calibrator 214 multiplies a calibration value N by the Q channel transmission signal, thereby outputting a new Q channel transmission signal for which the imbalance characteristics have been calibrated.

Figure 3:
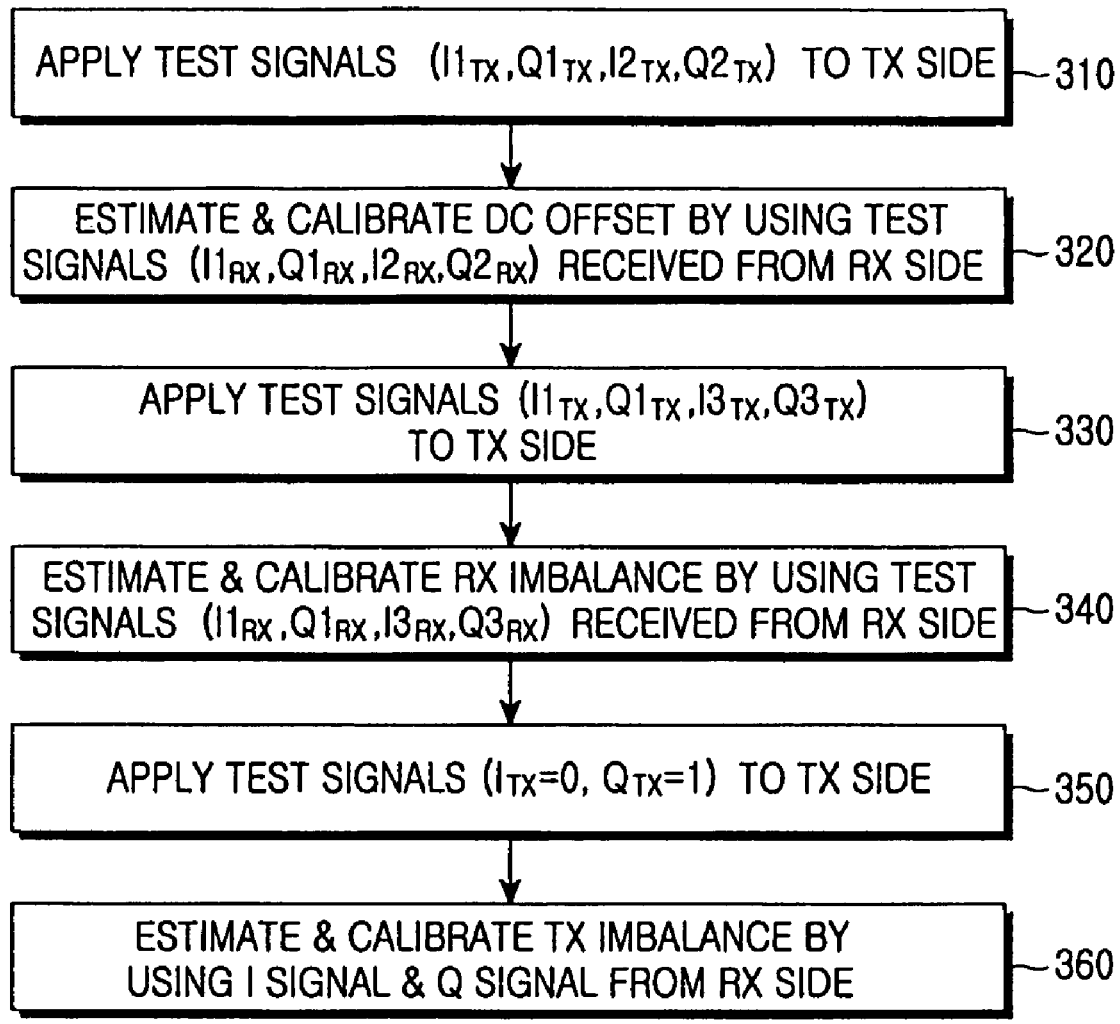
FIG. 3 is a flowchart of a process for self-calibration by a DSP according to the present invention.

FIG. 3 is a flowchart of a process for self-calibration by a DSP according to the present invention. In FIG. 3, steps 310 and 320 correspond to steps for calibrating the DC offset characteristics of the RX side, steps 330 and 340 correspond to steps for calibrating the imbalance characteristics of the RX side, and steps 350 and 360 correspond to steps for calibrating the imbalance characteristics of the TX side.

Referring to FIG. 3, the DSP 210 applies test signals $I1_{TX}$, $I2_{TX}$, $Q1_{TX}$, and $Q2_{TX}$ for calibrating the DC offset of the RX side to the TX side (step 310). The test signals are applied to the I channel path or the Q channel path according to their paths. Specifically, $I1_{TX}$ and $Q1_{TX}$ are simultaneously applied first to the I channel path and the Q channel path, respectively. Then, after a predetermined time interval from the application of $I1_{TX}$ and $Q1_{TX}$, $I2_{TX}$ and $Q2_{TX}$ are simultaneously applied to the I channel path and the Q channel path, respectively.

The DSP 210 receives the test signals $I1_{RX}$, $I2_{RX}$, $Q1_{RX}$, and $Q2_{RX}$ from the RX side (step 320). The test signals $I1_{RX}$, $I2_{RX}$, $Q1_{RX}$, and $Q2_{RX}$ received from the RX side correspond to the test signals $I1_{TX}$, $I2_{TX}$, $Q1_{TX}$, and $Q2_{TX}$ applied to the TX side. Further, the DSP 210 determines DC offset calibration values for calibrating the DC offset characteristics for the I channel path and the Q channel path of the RX side by using the received test signals $I1_{RX}$, $I2_{RX}$, $Q1_{RX}$, and $Q2_{RX}$. The DC offset calibration values can be determined based on the DC offset characteristics estimated by Equation (4). The DSP converts the determined offset calibration values to analog signals and then provides the analog signals to the RX side, thereby calibrating the DC offset characteristics for the I channel reception signal and the Q channel reception signal.

The DSP 210 applies test signals $I1_{TX}$, $I3_{TX}$, $Q1_{TX}$, and $Q3_{TX}$ for calibrating the imbalance characteristics of the RX side to the TX side (step 330). The test signals are applied to the I channel path or the Q channel path according to their paths. Specifically, $I1_{TX}$ and $Q1_{TX}$ are simultaneously applied first to the I channel path and the Q channel path, respectively. Then, after a predetermined time interval from the application of $I1_{TX}$ and $Q1_{TX}$, $I3_{TX}$ and $Q3_{TX}$ are simultaneously applied to the I channel path and the Q channel path, respectively.

The DSP 210 receives the test signals $I1_{RX}$, $I3_{RX}$, $Q1_{RX}$, and $Q3_{RX}$ from the RX side (step 340). The test signals $I1_{RX}$, $I3_{RX}$, $Q1_{RX}$, and $Q3_{RX}$ received from the RX side correspond to the test signals $I1_{TX}$, $I3_{TX}$, $Q1_{TX}$, and $Q3_{TX}$ applied to the TX side. Further, the DSP 210 estimates the gain imbalance characteristic α2 and the phase imbalance characteristic φ2 by using the received test signals $I1_{RX}$, $I3_{RX}$, $Q1_{RX}$, and $Q3_{RX}$. The gain imbalance characteristic α2 and the phase imbalance characteristic φ2 can be estimated by using Equation (6).

Further, the DSP 210 calculates the calibration values K and L for calibrating the imbalance characteristics between the I channel path and the Q channel path of the RX side by using the gain imbalance characteristic α2 and the phase imbalance characteristic φ2. The calibration values K and L can be calculated by using Equation (7).

The DSP 210 calibrates the imbalance characteristics between the I channel reception signal and the Q channel reception signal by using the calibration values K and L. The calibration of the imbalance characteristics can be achieved by outputting a Q channel reception signal obtained by adding the I channel reception signal multiplied by K and the Q channel reception signal multiplied by L.

The DSP 210 applies test signals $I_{TX}$ and $Q_{TX}$ for calibrating the imbalance characteristics of the TX side to the TX side (step 350). The test signals are applied to the I channel path or the Q channel path according to their paths. It is assumed that each of the test signals $I_{TX}$ has a value of 0 and $Q_{TX}$ has a value of 1.

The DSP 210 applies test signals $I_{RX}$ and $Q_{RX}$ from the RX side (step 360). The test signals $I_{RX}$ and $Q_{RX}$ from the RX side correspond to the test signals $I_{TX}$ and $Q_{TX}$ applied to the TX side. Further, the DSP 210 estimates the gain imbalance characteristic α1 and the phase imbalance characteristic φ1 by using the received test signals $I_{RX}$ and $Q_{RX}$. The gain imbalance characteristic α1 and the phase imbalance characteristic φ1 can be estimated by using Equation (10).

Further, the DSP 210 calculates the calibration values M and N for calibrating the imbalance characteristics between the I channel path and the Q channel path of the TX side by using the gain imbalance characteristic α1 and the phase imbalance characteristic φ1. The calibration values M and N can be calculated by using Equation (11).

The DSP 210 calibrates the imbalance characteristics between the I channel transmission signal and the Q channel transmission signal by using the calibration values M and N. The calibration of the imbalance characteristics can be achieved by outputting a new I channel transmission signal obtained by adding the I channel transmission signal and the Q channel transmission signal multiplied by M, and by outputting a new Q channel transmission signal obtained by multiplying the Q channel transmission signal by N.

Figure 4:
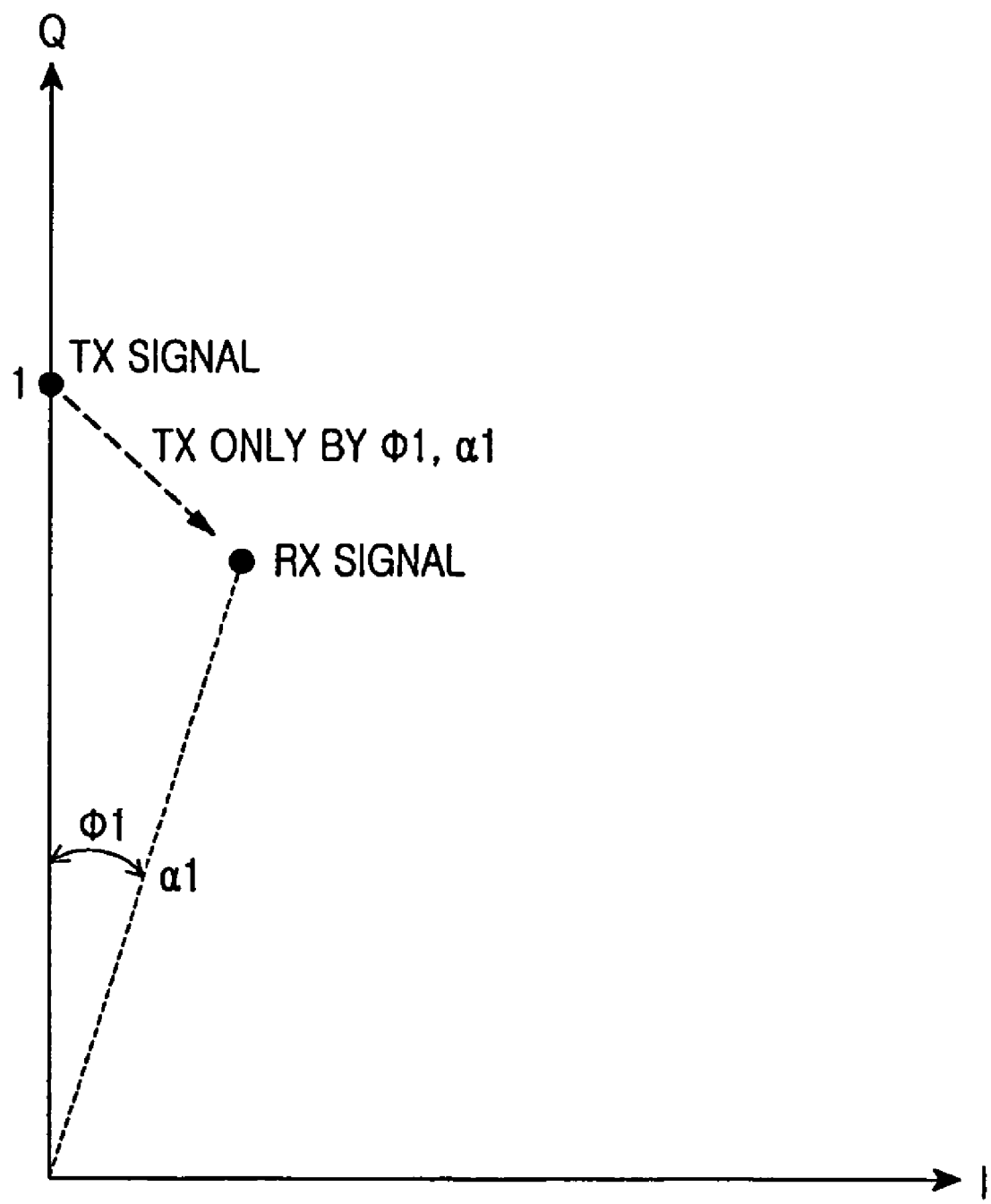
FIG. 4 is a graph for illustrating a comparison between a test, signal transmitted to the transmission side and a test signal received from the reception side.

FIG. 4 is a graph for illustrating a comparison between a test signal (TX signal) transmitted to the TX side and a test signal (RX signal) received from the RX side. FIG. 4 is based on an assumption that the DC offset characteristic and the imbalance characteristic of the RX side have been already calibrated.

As noted from FIG. 4, the TX signal and the RX signal coincide with each other due to α1 and φ1 caused by the imbalance characteristics of the TX side. Therefore, the present invention has proposed a solution for estimating and then compensating α1 and φ1. By calibrating the imbalance characteristics of the TX side as described above, it is possible to make the TX signal and the RX signal coincide with each other.

According to the present invention as described above, it is possible to easily calibrate the DC offset and the imbalance between the I channel and the Q channel by using a transmitter and a receiver of a mobile terminal without an additional circuit or additional power consumption. As a result, the present invention can minimize the price and size of a mobile terminal and can provide a mobile terminal which can perform self-calibration.

Further, according to the present invention, even though the DC offset characteristic and the imbalance characteristic change due to external factors, the mobile station can periodically reflect such changes and thus can maintain optimum performance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for self-calibrating a transceiver, the method includes generating a pair of signals including a first in-phase channel test transmission signal and a first quadrature-phase channel test transmission signal in an analog baseband;

converting the first in-phase channel test transmission signal and the first quadrature-phase channel test transmission signal of the analog baseband to a first in-phase channel test transmission signal and a first quadrature-phase channel test transmission signal of a Radio Frequency (RF) band, respectively, and applying the first in-phase channel test transmission signal and the first quadrature-phase channel test transmission signal of the RF band to a reception side through a test path for applying an RF band signal from a transmission side to the reception side;

converting the first in-phase channel test transmission signal and the first quadrature-phase channel test transmission signal of the RF band to a first in-phase channel test reception signal and a first quadrature-phase channel test reception signal of the analog baseband;

generating a pair of signals including a second in-phase channel test transmission signal and a second quadrature-phase channel test transmission signal in the analog baseband;

converting the second in-phase channel test transmission signal and the second quadrature-phase channel test transmission signal of the analog baseband to a second in-phase channel test transmission signal and a second quadrature-phase channel test transmission signal of an RF band and applying the second in-phase channel test transmission signal and the second quadrature-phase channel test transmission signal of the RF band to the reception side through the test path;

converting the second in-phase channel test transmission signal and the second quadrature-phase channel test transmission signal of the RF band to a second in-phase channel test reception signal and a second quadrature-phase channel test reception signal of the analog baseband;

estimating and calibrating a direct current (DC) offset characteristic for an in-phase channel reception signal in the analog baseband of the reception side by using a mean value of the first in-phase channel test reception signal and the second in-phase channel test reception signal of the analog baseband; and estimating and calibrating a DC offset characteristic for a quadrature-phase channel reception signal in the analog baseband of the reception side by using a mean value of the first quadrature-phase channel test reception signal and the second quadrature-phase channel test reception signal of the analog baseband.

2. The method as claimed in claim 1, wherein the first in-phase channel test transmission signal and the second in-phase channel test transmission signal generated in the analog baseband have a phase difference of 180 degrees, and the first quadrature-phase channel test transmission signal and the second quadrature-phase channel test transmission signal generated in the analog baseband have a phase difference of 180 degrees.

3. A method for self-calibrating in a transceiver, the method includes
generating a pair of signals including a first in-phase channel test transmission signal and a first quadrature-phase channel test transmission signal in an analog baseband;
converting the first in-phase channel test transmission signal and the first quadrature-phase channel test transmission signal from the analog baseband to a Radio Frequency (RF) band and applying the first in-phase channel test transmission signal and the first quadrature-phase channel test transmission signal of the RF band to a reception side through a test path for applying an RF band signal from a transmission side to the reception side;
converting the first in-phase channel test transmission signal and the first quadrature-phase channel test transmission signal of the RF band to a first in-phase channel test reception signal and a first quadrature-phase channel test reception signal of the analog baseband;
generating a pair of signals including a third in-phase channel test transmission signal and a third quadrature-phase channel test transmission signal in the analog baseband;
converting the third in-phase channel test transmission signal and the third quadrature-phase channel test transmission signal of the analog baseband to a third in-phase channel test transmission signal and a third quadrature-phase channel test transmission signal of an RF band and applying the third in-phase channel test transmission signal and the third quadrature-phase channel test transmission signal of the RF band to the reception side through the test path;
converting the third in-phase channel test transmission signal and the third quadrature-phase channel test transmission signal of the RF band to a third in-phase channel test reception signal and a third quadrature-phase channel test reception signal of the analog baseband;
calculating a gain imbalance of the reception side by using the first in-phase channel test reception signal and the third in-phase channel test reception signal of the analog baseband and the first quadrature-phase channel test reception signal and the third quadrature-phase channel test reception signal of the analog baseband;
calculating a phase imbalance of the reception side by using the first in-phase channel test reception signal and the third in-phase channel test reception signal of the analog baseband and the first quadrature-phase channel test reception signal and the third quadrature-phase channel test reception signal of the analog baseband;
calculating calibration values by using the gain imbalance and the phase imbalance; and
calibrating imbalance characteristics between an in-phase channel signal and a quadrature-phase channel signal in a digital baseband of the reception side by using the calibration values.

4. The method as claimed in claim 3, wherein the first in-phase channel test transmission signal and the third in-phase channel test transmission signal generated in the analog baseband have a phase difference of 90 degrees, and the first quadrature-phase channel test transmission signal and the third quadrature-phase channel test transmission signal generated in the analog baseband have a phase difference of 90 degrees.

5. The method as claimed in claim 3, wherein:
the gain imbalance α2 of the reception side is calculated by substituting the first in-phase channel test reception signal $I1_{Rx}$ and the third in-phase channel test reception signal $I3_{RX}$ of the analog baseband and the first quadrature-phase channel test reception signal $Q1_{RX}$ and the third quadrature-phase channel test reception signal $Q3_{RX}$ of the analog baseband into $$\alpha 2 = \sqrt{\frac{Q1_{RX}^2 + Q3_{RX}^2}{I1_{RX}^2 + I3_{RX}^2}} \ ;$$

the phase imbalance φ2 of the reception side is calculated by substituting the first in-phase channel test reception signal $I1_{RX}$ and the third in-phase channel test reception signal $I3_{Rx}$ of the analog baseband and the first quadrature-phase channel test reception signal $Q1_{RX}$ and the third quadrature-phase channel test reception signal $Q3_{RX}$ of the analog baseband into $$\phi 2 = \tan^{-1}\left(\frac{I3_{RX} \times Q3_{RX} + I1_{RX} \times Q1_{RX}}{I1_{RX} \times Q3_{RX} + I3_{RX} \times Q1_{RX}}\right);$$

the calibration values K and L are calculated by substituting the gain imbalance α2 and the phase imbalance φ2 into $$K = -\tan\phi 2$$
$$L = \frac{1}{\alpha 2 \cos\phi 2}; \text{ and}$$

the imbalance characteristics between an in-phase channel signal and a quadrature-phase channel signal in a digital baseband of the reception side are calibrated by using the calibration values K and L.

6. A method for self-calibrating in a transceiver, the method includes:
generating, by a transmission side, a pair of signals including an in-phase channel test transmission signal and a quadrature-phase channel test transmission signal in an analog baseband;
converting the in-phase channel test transmission signal and the quadrature-phase channel test transmission signal of the analog baseband to an in-phase channel test transmission signal and a quadrature-phase channel test transmission signal of a Radio Frequency (RF) band, respectively, and applying the in-phase channel test transmission signal and the quadrature-phase channel test transmission signal of the RF band to a reception side through a test path for applying the RF band signal from the transmission side to the reception side;
converting, by the reception side, the applied in-phase channel test transmission signal and the applied quadrature-phase channel test transmission signal of the RF band to an in-phase channel test reception signal and a quadrature-phase channel test reception signal of the analog baseband;

calculating a gain imbalance of the transmission side by using the converted in-phase channel test reception signal and the converted quadrature-phase channel test reception signal of the analog baseband;

calculating a phase imbalance of the transmission side by using the converted in-phase channel test reception signal and the converted quadrature-phase channel test reception signal of the analog baseband;

calculating calibration values by using the gain imbalance and the phase imbalance;

calibrating imbalance characteristics between an in-phase channel signal and a quadrature-phase channel signal in a digital baseband of the transmission side by using the calibration values; and wherein:

the gain imbalance $\alpha 1$ of the transmission side is calculated by substituting the in-phase channel test reception signal $I_{RX}$ and the quadrature-phase channel test reception signal $Q_{RX}$ of the analog baseband into $$\alpha 1 = \sqrt{I_{RX}^2 + Q_{RX}^2}\ ;$$

the phase imbalance $\phi 1$ of the transmission side is calculated by substituting the in-phase channel test reception signal $I_{RX}$ and the quadrature-phase channel test reception signal $Q_{RX}$ of the analog baseband into $$\phi 1 = \tan^{-1} \frac{I_{RX}}{Q_{RX}};$$

the calibration values M and N are calculated by substituting the gain imbalance $\alpha 1$ and the phase imbalance $\phi 1$ into $$M = -\tan\phi 1$$
$$N = \frac{1}{\alpha 1 \cos\phi 1}; \text{ and}$$

the imbalance characteristics between an in-phase channel signal and a quadrature-phase channel signal in a digital baseband of the transmission side are calibrated by using the calibration values M and N.

7. A method for self-calibrating in a transceiver, the method includes:

applying a pair of signals including a first in-phase channel test transmission signal and a first quadrature-phase channel test transmission signal to a transmission side and receiving a first in-phase channel test reception signal and a first quadrature-phase channel test reception signal from a reception side;

applying a pair of signals including a second in-phase channel test transmission signal and a second quadrature-phase channel test transmission signal to the transmission side and receiving a second in-phase channel test reception signal and a second quadrature-phase channel test reception signal from the reception side;

calibrating a direct current (DC) offset characteristic for an in-phase channel reception signal in the analog baseband of the reception side by using a mean value of the first in-phase channel test reception signal and the second in-phase channel test reception signal of the analog baseband;

calibrating a DC offset characteristic for a quadrature-phase channel reception signal in the analog baseband of the reception side by using a mean value of the first quadrature-phase channel test reception signal and the second quadrature-phase channel test reception signal of the analog baseband;

applying the first in-phase channel test transmission signal and the first quadrature-phase channel test transmission signal to the transmission side and then receiving the first in-phase channel test reception signal and the first quadrature-phase channel test reception signal from the reception side;

applying a pair of signals including a third in-phase channel test transmission signal and a third quadrature-phase channel test transmission signal to the transmission side and receiving a third in-phase channel test reception signal and a third quadrature-phase channel test reception signal from the reception side;

calculating a gain imbalance $\alpha 2$ of the reception side by substituting the first in-phase channel test reception signal $I1_{RX}$ and the third in-phase channel test reception signal $I3_{RX}$ of the analog baseband and the first quadrature-phase channel test reception signal $Q1_{RX}$ and the third quadrature-phase channel test reception signal $Q3_{RX}$ of the analog baseband into $$\alpha 2 = \sqrt{\frac{Q1_{RX}^2 + Q3_{RX}^2}{I1_{RX}^2 + I3_{RX}^2}}\ ;$$

calculating a phase imbalance $\phi 2$ of the reception side by substituting the first in-phase channel test reception signal $I1_{RX}$ and the third in-phase channel test reception signal $I3_{RX}$ of the analog baseband and the first quadrature-phase channel test reception signal $Q1_{RX}$ and the third quadrature-phase channel test reception signal $Q3_{RX}$ of the analog baseband into $$\phi 2 = \tan^{-1}\left(\frac{I3_{RX} \times Q3_{RX} + I1_{RX} \times Q1_{RX}}{I1_{RX} \times Q3_{RX} + I3_{RX} \times Q1_{RX}}\right);$$

calculating calibration values K and L by substituting the gain imbalance $\alpha 2$ and the phase imbalance $\phi 2$ into $$K = -\tan\phi 2$$
$$L = \frac{1}{\alpha 2 \cos\phi 2}; \text{ and}$$

calibrating imbalance characteristics between an in-phase channel signal and a quadrature-phase channel signal in a digital baseband of the reception side by using the calibration values K and L.

8. The method as claimed in claim 7, wherein the first in-phase channel test transmission signal and the second in-phase channel test transmission signal generated in the analog baseband have a phase difference of 180 degrees, and the first quadrature-phase channel test transmission signal and the second quadrature-phase channel test transmission signal generated in the analog baseband have a phase difference of 180 degrees.

9. The method as claimed in claim 7, wherein the first in-phase channel test transmission signal and the third in-phase channel test transmission signal generated in the analog baseband have a phase difference of 90 degrees, and the first quadrature-phase channel test transmission signal and the third quadrature-phase channel test transmission signal generated in the analog baseband have a phase difference of 90 degrees.

10. The method as claimed in claim 7, further comprising:

applying a pair of signals including a fourth in-phase channel test transmission signal and a fourth quadrature-phase channel test transmission signal to the transmission side and receiving a fourth in-phase channel test reception signal and a fourth quadrature-phase channel test reception signal from the reception side;

calculating a gain imbalance $\alpha 1$ of the transmission side by substituting the fourth in-phase channel test reception signal $I_{RX}$ and the fourth quadrature-phase channel test reception signal $Q_{RX}$ of the analog baseband into $$\alpha 1 = \sqrt{I_{RX}^2 + Q_{RX}^2} \; ;$$

calculating a phase imbalance $\phi 1$ of the transmission side by substituting the fourth in-phase channel test reception signal $I_{RX}$ and the fourth quadrature-phase channel test reception signal $Q_{RX}$ of the analog baseband into $$\phi 1 = \tan^{-1} \frac{I_{RX}}{Q_{RX}} ;$$

calculating calibration values M and N by substituting the gain imbalance $\alpha 1$ and the phase imbalance $\phi 1$ into $$M = -\tan\phi 1$$
$$N = \frac{1}{\alpha 1 \cos\phi 1} ; \text{ and}$$

calibrating the imbalance characteristics between an in-phase channel signal and a quadrature-phase channel signal in a digital baseband of the transmission side by using the calibration values M and N.

11. The method as claimed in claim 10, wherein the fourth in-phase channel test transmission signal $I_{TX}$ and the fourth quadrature-phase channel test transmission signal $Q_{TX}$ of are defined by $I_{TX}=0$ $Q_{TX}=1$.

* * * * *